(12) United States Patent
Inoue et al.

(10) Patent No.: US 7,081,005 B2
(45) Date of Patent: Jul. 25, 2006

(54) ELECTRIC-CONNECTION TESTING DEVICE

(75) Inventors: Kenichi Inoue, Kobe (JP); Akashi Yamaguchi, Kobe (JP); Takayuki Hirano, Kobe (JP); Tsutomu Mirimoto, Kobe (JP); Hiroshi Gotoh, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 0 days.

(21) Appl. No.: 10/928,254

(22) Filed: Aug. 30, 2004

(65) Prior Publication Data
US 2005/0140383 A1    Jun. 30, 2005

(30) Foreign Application Priority Data
Sep. 8, 2003    (JP) .............................. 2003-315449

(51) Int. Cl.
*H01R 13/00*    (2006.01)

(52) U.S. Cl. ..................................................... 439/482

(58) Field of Classification Search ................ 439/482; 324/754, 758, 757
See application file for complete search history.

(56) References Cited

U.S. PATENT DOCUMENTS 4,918,383 A * 4/1990 Huff et al. ................... 324/757
5,180,977 A * 1/1993 Huff ........................... 324/754

FOREIGN PATENT DOCUMENTS

JP    2002-311049    4/2001

* cited by examiner

*Primary Examiner*—Javaid H. Nasri
(74) *Attorney, Agent, or Firm*—Reed Smith LLP; Stanley P. Fisher, Esq.; Juan Carlos A. Marquez, Esq.

(57) ABSTRACT

In an electric-connection testing device of the present invention, a base and a rigid body, to which a substrate provided with a plurality of contacts are secured, are integrated and sandwich a leaf spring. The leaf spring has a spring structure with two or more independent elastic degrees of freedom. Such a small, simple, and adjustment-free structure can uniformize a pressing force applied from the contacts to electrodes of an object to be tested.

13 Claims, 7 Drawing Sheets

Z-TRANSLATION

θ-OSCILLATION

φ-OSCILLATION

FIG. 7

1) ELASTIC CONSTANT
   YOUNG'S MODULUS: E
   RIGIDITY MODULUS: G
   POISSON'S RATIO: $\nu$ $$G = \frac{E}{2(1+\nu)} \quad \cdots (1)$$

2) ELASTICITY MODULUS FOR LEAF-SPRING BEAM

A) FIXED END

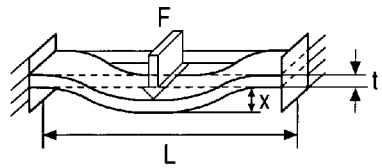

$$F = k_A \cdot x$$
$$k_A = 16EW\left(\frac{t}{L}\right)^3 \quad \cdots (2)$$

B) FREE END

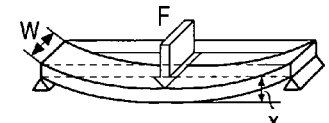

$$F = k_B \cdot x$$
$$k_B = 4EW\left(\frac{t}{L}\right)^3 \quad \cdots (3)$$

C) TORSION

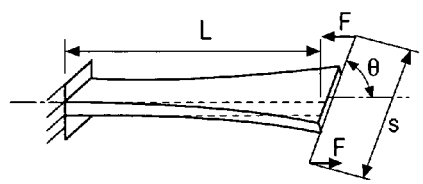

$$T \equiv s \cdot F = \tau \cdot \theta$$
$$\tau = \frac{\eta \cdot GWt^3}{L} \quad \cdots (4)$$
$$\eta \doteq 0.25\tan^{-1}\left(\frac{W}{t}\right) - 0.05$$

3) COMPOSITION RULES

P) PARALLEL

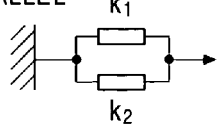

$$k = k_1 + k_2 \quad \cdots (5)$$

S) SERIES

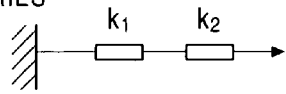

$$k = \left(\frac{1}{k_1} + \frac{1}{k_2}\right)^{-1} \quad \cdots (6)$$

Prior Art FIG. 8
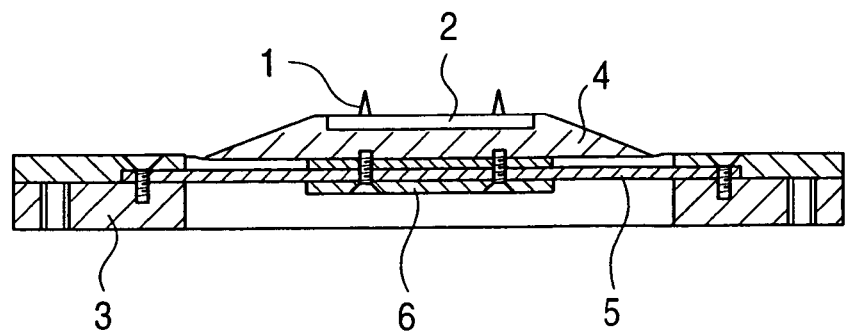
Prior Art FIG. 9
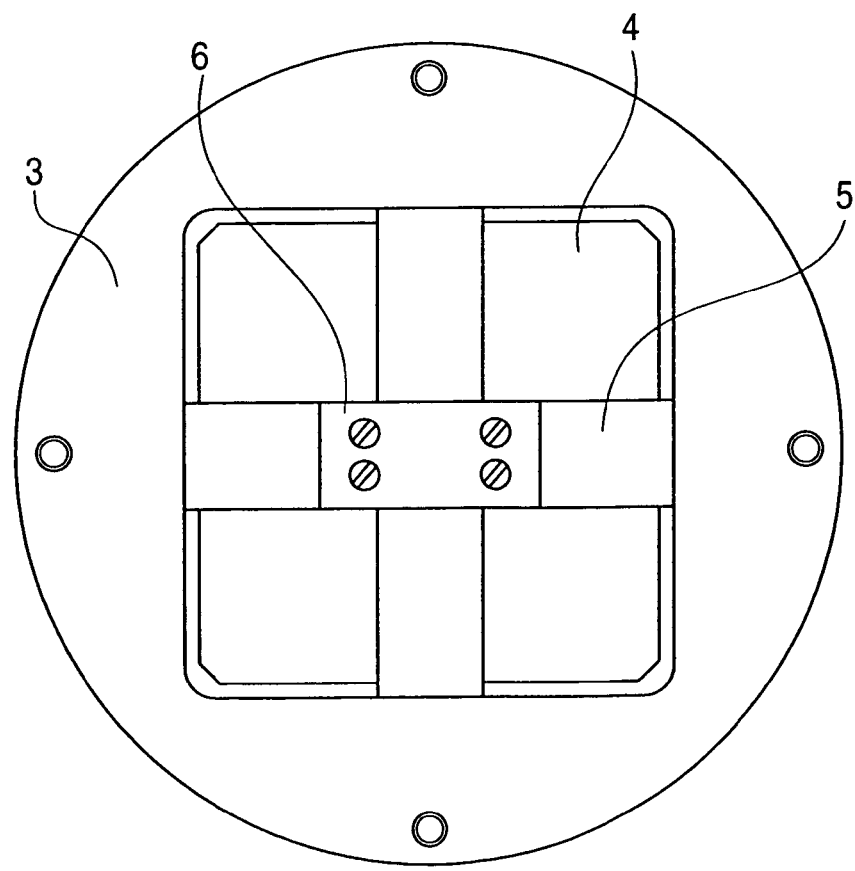

ELECTRIC-CONNECTION TESTING DEVICE

BACKGROUND OF THE INVENTION

1. Field of the Invention

The present invention relates to an electric-connection testing device used in electric tests on flat objects, such as integrated circuit boards and display boards.

2. Description of the Related Art

Electric tests on flat objects, such as semiconductor integrated circuit boards and display boards, are generally performed with an electric-connection testing device, such as a probe card. In an electric test, a plurality of electrodes of an object to be tested (hereinafter, may simply be referred to as an "object") are pressed with many contacts arranged in an electric-connection testing device and are energized under such a state. Examples of the electric-connection testing device of this type include a device in which an insulating solid body or a film substrate provided with many projecting electrodes (referred to as a "contact group" here) integrally formed with traces, which are connected to the respective electrodes, is mounted on an insulating base (see, for example, Japanese Unexamined Patent Application Publication No. 2002-311049).

FIGS. 8 and 9 show a known technology represented by an example disclosed in Japanese Unexamined Patent Application Publication No. 2002-311049 (a cross-shaped leaf-spring structure is integrated with a pyramid rigid block). In a contact unit to be pressed against electrodes of an object, a projecting contact group 1 and a substrate 2 provided with wiring of the contact group 1 are secured to a rigid body 4, which is bonded to a base 3 with a cross-shaped leaf spring 5 interposed between the rigid body 4 and the base 3. When the contact group 1 is pressed against the electrodes of the object, elastic deformation of the leaf spring 5 occurs as shown in FIGS. 10A to 10C and generates a pressing pressure of contacts (FIG. 10A) while compensating for a tilt error between the substrate 2 and the object (FIGS. 10B and 10C).

However, in the cross-shaped leaf-spring structure of a known electric-connection testing device described above, a translational degree of freedom (Z direction) related to the generation of a pressing pressure and two oscillation degrees of freedom ($\theta$ direction and $\phi$ direction) related to the compensation for a relative tilt error between the contact unit and the object are provided by elastic deformations of the same component. Therefore, the application of a pressure required for the contact group to ensure a good electric contact causes an excessive stress on a tilt-correction degree of freedom. This results in a nonuniform application of a pressing force from the contact group to the electrodes of the object, and an accurate electric test cannot be performed.

Theoretically, the cross-shaped leaf-spring structure described above can be replaced with a complex mechanical structure, such as a combination of a plurality of adjusting screws and a plurality of spiral springs having respective degrees of freedom, to achieve uniformity of the pressing force described above. However, the practical application of such a mechanical structure on a commercial scale is extremely difficult due to difficulties in ensuring precision and adjustment in assembly.

SUMMARY OF THE INVENTION

Accordingly, an object of the present invention is to provide an electric-connection testing device capable of solving the problem described above, having a small, simple, and adjustment-free structure, being capable of uniformizing a pressing force from its contacts to electrodes of an object to be tested, and being highly practicable.

As a result of dedicated study to achieve the object described above, the present inventors propose an electric-connection testing device characterized by the structure described below.

In an electric-connection testing device of the present invention where a base and a rigid body to which a substrate provided with a plurality of contacts are secured are integrated and sandwich a leaf spring, the leaf spring has a spring structure with two or more independent elastic degrees of freedom. When protruding electrodes, which include many contacts, are pressed against electrodes of an object to be tested, elastic deformation of the leaf spring generates a pressing pressure of the contacts and compensates for a tilt error between the substrate and the object. As a result, a pressing force applied to the electrodes of the object becomes equal at any position of the many contacts.

The leaf spring is a single flat plate and can be formed into a plurality of bands by creating at least one cutout. Here, different elasticity moduli suitable for each independent degree of freedom can be set depending on the effective length and width of each band.

The two or more independent elastic degrees of freedom include one degree of freedom that can provide a pressing force necessary for the contacts to ensure a good electric contact. This degree of freedom refers to a translational degree of freedom, in the direction orthogonal to the main surface of the leaf spring, having a relatively rigid elasticity modulus. The two or more independent elastic degrees of freedom also include at least one degree of freedom that has a relatively flexible elasticity modulus so that the plurality of contacts can compensate for a tilt error between an object to be tested and the contacts.

The most practical and desirable spring structure specifically includes three elastic degrees of freedom, that is, one translational degree of freedom in the direction orthogonal to the main surface of the leaf spring and two tilt-correction degrees of freedom corresponding to two oscillation angles of the substrate.

As for the leaf spring structure of the electric-connection testing device of the present invention, an annular band-plate structure surrounding the center of the leaf spring is a practical geometric form that can achieve a relatively low elasticity modulus. This structure is also desirable in that it can perform at least one tilt correction. Here, a conical pivot protrudes from the rigid body toward the center of the leaf spring, or protrudes from the center of the leaf spring toward the rigid body for allowing either of the contact points to serve as a supporting point for a degree of freedom of the tilt correction. Therefore, in an elastic deformation for a tilt correction, a relative displacement in the horizontal direction, which is orthogonal to the direction of the contacts that are pressed against the object, can be minimized.

While being provided with a supporting point for a degree of freedom of the tilt correction, the leaf spring is secured to the base at two points that are opposite with respect to the center of annular band plates, and is further secured to the rigid body at two other points that are opposite with respect to the center of the annular band plates. Such a structure is a means for ensuring one tilt correction.

In an elastic deformation for generating a pressing force, when a contact point of the conical pivot serves as a point of action of a translational degree of freedom orthogonal to the main surface of the leaf spring, a relative displacement in the horizontal direction, which is orthogonal to the direction of the contacts that are pressed against the object, can also be minimized.

Moreover, the leaf spring may have a structure in which double-annular band plates are disposed in a gimbal arrangement, and the outer band plate is connected to the rigid body. Such a structure is a means for ensuring two tilt correction.

In the leaf spring having the structure described above, one translational degree of freedom to generate a pressing force and two oscillation degrees of freedom to compensate for a relative tilt error between the contacts and an object to be tested can be achieved by independent elastic deformations of the single leaf spring, even if a relative tilt between the electric-connection testing device and the object is large. Thus, a pressing force necessary for each contact to ensure a good electric contact is provided, while a relative tilt between the electric-connection testing device and the object is compensated at a sufficiently low elasticity modulus. As a result, a pressing force applied from the contacts to electrodes of the object is uniformized, and accurate electric-connection tests can be performed by a practical unit structure.

The present invention characterized in having such a structure can provide an electric-connection testing device that can uniformize, by a small, simple, and adjustment-free structure, a pressing force applied from contacts to electrodes of an object to be tested and is excellent in practicality. This is extremely advantageous in the present technical field.

BRIEF DESCRIPTION OF THE DRAWINGS

FIG. 7 shows dynamics formulas on which to base dynamics models of the present invention, the dynamics formulas being related to a leaf spring.

FIG. 8 is a cross-sectional view showing a known electric-connection testing device.

FIG. 9 is a plan view showing the known electric-connection testing device.

DESCRIPTION OF THE PREFERRED EMBODIMENTS

Similarly to a probe card, an electric-connection testing device of the present invention is used, in electric tests on a rectangular integrated circuit board, for fine movements of probe tips such that many probe tips can be electrically brought into contact with electrodes of the integrated circuit board. The rectangular integrated circuit board to be tested has a plurality of input/output electrodes arranged along each side at a predetermined pitch. Although many contacts, which have probe tips with aligned heights, of the electric-connection testing device of the present invention are arranged on an insulating substrate with high surface accuracy, errors in a wafer holder and a moving stage are unavoidable. It is inevitable in actual electric tests that the substrate and a wafer plane are slightly tilted. Therefore, the present invention provides a flexible structure including a leaf spring capable of compensating for tilt errors such that all the contacts are equally weighted.

Embodiments of the present invention will now be described in detail with reference to the drawings.

Figure 1:
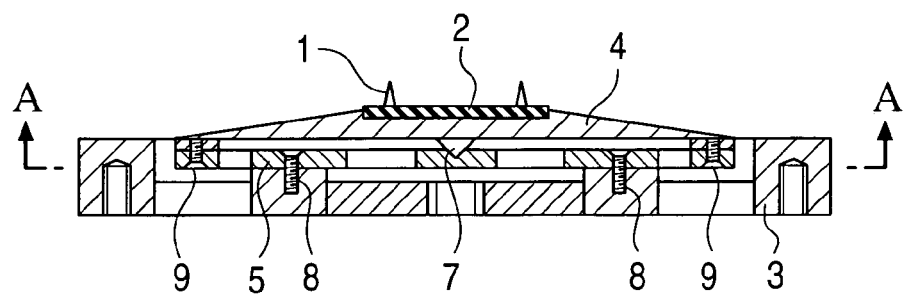
FIG. 1 is a cross-sectional view showing an embodiment of an electric-connection testing device according to the present invention.
Figure 2:
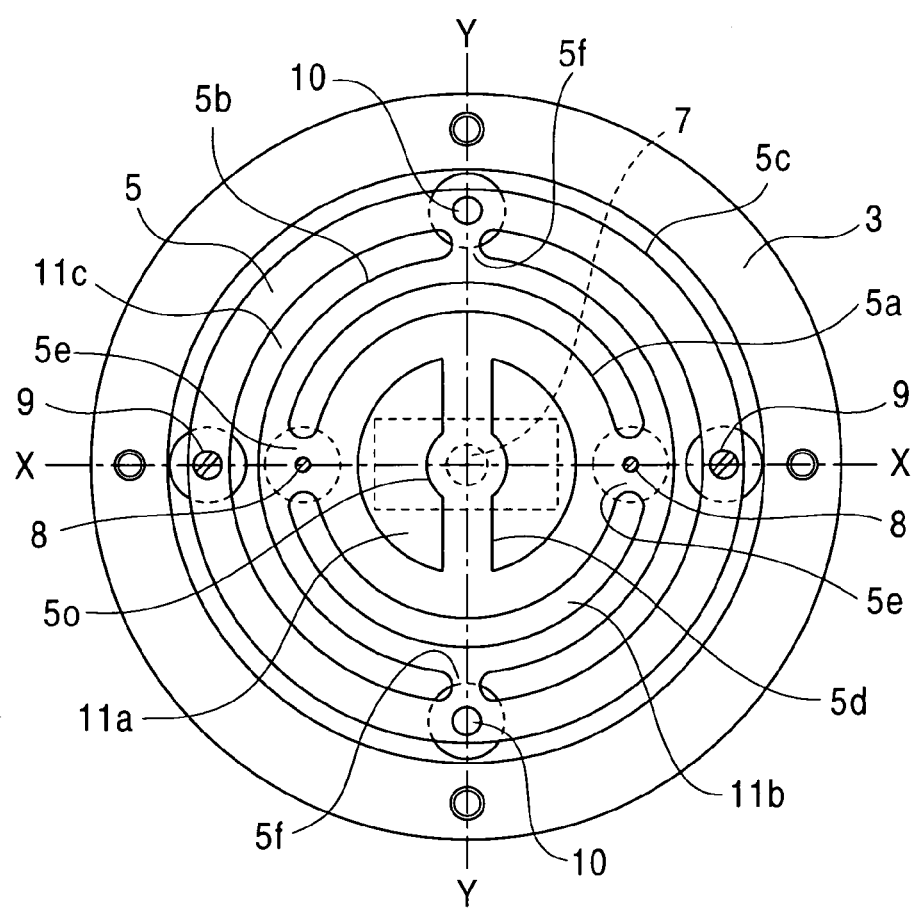
FIG. 2 is a plan view showing the embodiment of the electric-connection testing device according to the present invention.

FIG. 1 is a vertical cross-sectional view showing the structure of a typical embodiment of the electric-connection testing device according to the present invention. FIG. 2 is a plan view taken along line A—A in FIG. 1. A protruding conductive contact group 1 is secured to the upper surface of a rectangular substrate 2 where many traces (not shown) of the contact group 1 are provided. The substrate 2 is mounted on the upper portion of a rigid body 4 in the shape of a truncated cone. A circular leaf spring 5 made of metal, such as stainless steel or phosphor bronze, having a large deformation region, and disposed under the rigid body 4 is secured with setscrews 9 and 10 at four points dividing the circumference into four parts. The leaf spring 5 is further secured to a disk-shaped base 3 underneath with setscrews 8 at two points dividing the circumference into two parts. Thus, the base 3 and the rigid body 4 in which the substrate 2 provided with the contact group 1 is mounted are integrated and sandwich the leaf spring 5.

As shown in FIG. 2, the leaf spring 5 has a circular band-plate structure integrally formed in one piece. That is, a disk 5o is disposed at the center, and a first circular band (first segment) 5a surrounding the disk 5o, a second circular band (second segment) 5b surrounding the first circular band 5a, and an outermost third circular band (third segment) 5c surrounding the second circular band 5b are arranged in triple concentric circles. The disk 5o and the first circular band 5a are connected by a long linear band 5d, which includes two separate portions, extending along a centerline (Y—Y) of the disk and the circular bands. The first circular band 5a and the second circular band 5b are connected by two short bands 5e and 5e arranged along a centerline (X—X) orthogonal to the centerline (Y—Y). Moreover, the second circular band 5b and the third circular band 5c are connected by two short bands 5f and 5f arranged along the centerline (Y—Y). The setscrews 9 on the third circular band 5c are located along the centerline (X—X), while the setscrews 10 on the third circular band 5c are located along the centerline (Y—Y). As described above, connected portions between the disk and each circular band are displaced by 90 degrees with respect to each other so as to integrally form the leaf spring 5 in a so-called gimbal arrangement. Here, semicircular cutouts 11a are formed inside the first circular band 5a, semiannular cutouts 11b are formed between the first circular band 5a and the second circular band 5b, and semiannular cutouts 11c are formed between the second circular band 5b and the third circular band 5c.

A conical pivot 7 in the shape of an inverted cone made of hard metal or ceramic is disposed at the center of the lower segment of the rigid body 4. As shown in FIG. 1, the bottom tip of the conical pivot 7 protruding downward is in contact with and is supported by the center of the disk 5o, that is, the center of the leaf spring 5.

The leaf spring 5 has an excellent flexible structure that is easily produced by creating the cutouts 11a to 11c in a single plate, for example, with electrical discharge machining so as to form a triple circular band. Since no assembly is required, a high-precision geometric configuration can be directly formed as designed.

Figure 3A:
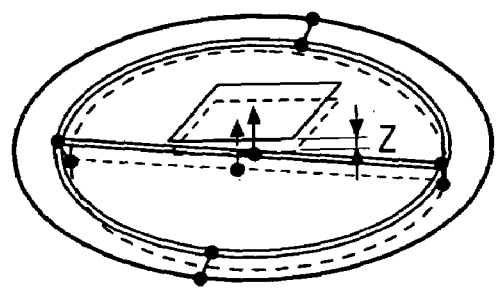
FIGS. 3A to 3C illustrate three degrees of freedom (Z, θ, φ) of elastic deformation according to embodiments of the present invention.
Figure 3B:
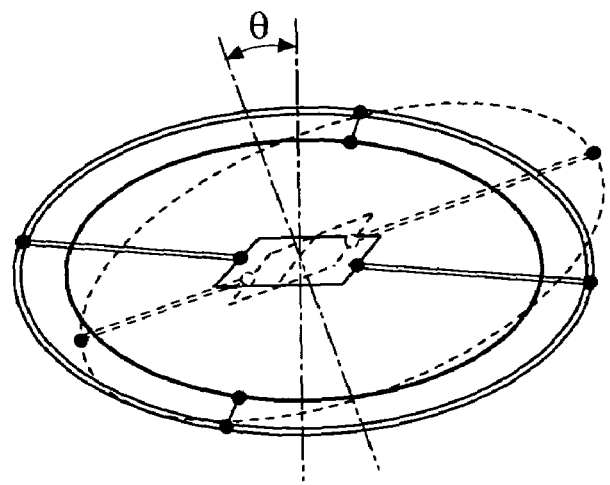
Figure 3C:
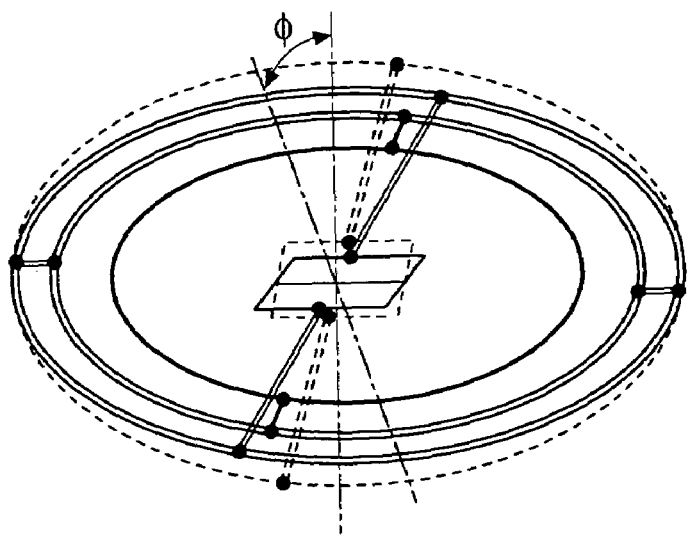
Figure 4A:
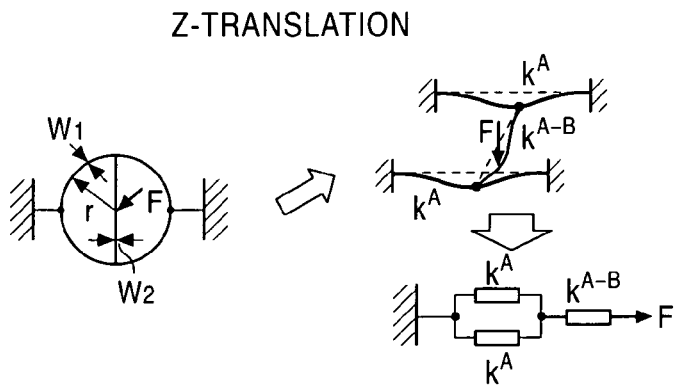
FIGS. 4A to 4C illustrate dynamics models of elastic deformation according to the embodiments of the present invention.
Figure 4B:
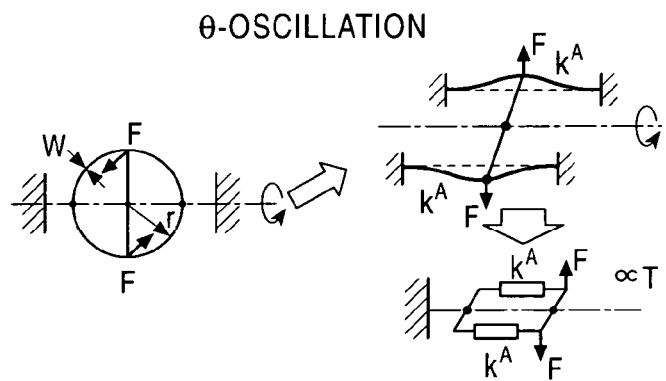
Figure 4C:
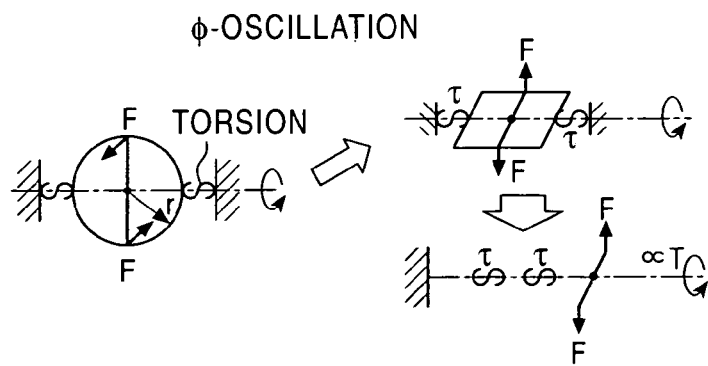

In connection with three elastic degrees of freedom (Z translation, θ oscillation, and φ oscillation) corresponding to the triple circular-band spring structure of the present embodiment, FIGS. 3A to 3C illustrate elastic deformations in respective degrees of freedom. In addition, FIGS. 4A to 4C illustrate dynamics models of respective elastic deformations. For reference purposes, FIG. 7 shows dynamics formulas on which to base the dynamics models of the present invention, the dynamics formulas being related to the leaf spring 5.

The following discusses, with reference to the elastic deformation models, a typical behavior of each circular band in the leaf-spring structure according to the present embodiment together with methods for determining elasticity moduli corresponding to the three elastic degrees of freedom.

As described above, the first circular band 5a includes the linear band 5d extending along the centerline (Y—Y). The center of the first circular band 5a is in contact with the tip of the conical pivot 7 protruding downward from the rigid body 4 to the disk 5o of the leaf spring 5. The first circular band 5a and the second circular band 5b are connected by the short bands 5e and 5e arranged in the direction orthogonal to the extending direction of the linear band 5d. The short bands 5e and 5e are secured to the base 3 with the setscrews 8 and 8 at the respective centers. The first circular band 5a is considered as a combination of two semicircular beams with respect to the base 3, the beams having two fixed ends secured with the respective setscrews 8 and 8. The linear band 5d extending along the centerline of the first circular band 5a and connected to the first circular band 5a at both ends are considered as a beam centered on the center of the first circular band 5a. When the contact group 1 is pressed against the object to be tested, the tip of the conical pivot 7, that is, the center of the linear band 5d serves as a point of action and an elastic deformation, with respect to the base 3, in the direction normal to the plane of the leaf spring 5, that is, in the Z direction (translation) occurs as shown in FIG. 3A. This elastic deformation causes the contact group 1 to produce stress proportional to the amount of displacement, thereby allowing the contact group 1 to apply a pressing force, which is required for ensuring a good electric contact, to the object to be tested. Thus, this leaf spring structure is modeled as a two-step beam structure as shown in FIG. 4A. The elasticity modulus (k) can be predicted by the formula as follows:

$$k = \left( \frac{1}{2k^A(W_1, \pi r)} + \frac{1}{k^{A-B}(W_2, 2r)} \right)^{-1} \quad \text{[FORMULA 1]}$$

where $W_2$ is the width of the linear band 5d, $2r$ is the diameter of the first circular band 5a, and $W_1$ is the width of the first circular band 5a, and provided that:

$$k^A(W, L) = 16EW\left(\frac{t}{L}\right)^3 \quad \text{[FORMULA 2]}$$

$$k^{A-B}(W, L) \approx (4-16)EW\left(\frac{t}{L}\right)^3$$

The second circular band 5b is secured to the base 3 with the setscrews 8 and 8 and is connected to the outermost third circular band 5c by the short bands 5f and 5f, which are displaced 90 degrees from the respective setscrews 8 and 8. The short bands 5f and 5f are secured to the rigid body 4 with the setscrews 10 and 10 at two points. In this structure, the second circular band 5b is considered as a combination of two semicircular beams having two fixed ends secured with the respective setscrews 8 and 8. While the setscrews 10 and 10 serve as the points of action, the degree of freedom of the rigid body 4 is restricted at the tip of the conical pivot 7. Therefore, when the contact group 1 is pressed against an object slightly tilted, an oscillation torque with respect to the tip of the conical pivot 7 is produced. Then, as shown in FIG. 3B, elastic deformation having a tilt degree of freedom in the θ direction, with respect to the tip of the conical pivot 7, is produced. Since this elastic deformation compensates for the tilt error between the object to be tested and the contact group 1, electric contact obtained by all the contacts of the contact group 1 is uniformized. Thus, this leaf-spring structure is modeled as torque generation based on a one-step beam structure as shown in FIG. 4B. The elasticity modulus (τθ) can be predicted by the diameter and the width of the second circular band 5b.

$F = k^A \cdot x$ $x = r\theta$ $T = 2r \cdot F \quad \text{[FORMULA 3]}$ thus, $T = 2r^2 k^A(W, 2r) \cdot \theta \quad \text{[FORMULA 4]}$ therefore, $\tau_\theta = 2r^2 k^A(W, 2r) \quad \text{[FORMULA 5]}$ The outermost third circular band 5c is secured to the rigid body 4 at four points, with the setscrews 10 and 10, and the setscrews 9 and 9 that are displaced 90 degrees from the respective setscrews 10 and 10. The third circular band 5c is connected to the second circular band 5b by the short bands 5f and 5f, which are relatively short and narrow, at the positions adjacent to the setscrews 10 and 10. The degree of freedom of the rigid body 4 is restricted at the tip of the conical pivot 7. Therefore, when the contact group 1 is pressed against an object slightly tilted, an oscillation torque with respect to the tip of the conical pivot 7 is produced. Then, as shown in FIG. 3C, "torsional" elastic deformation with respect to the tip of the conical pivot 7 and having a tilt degree of freedom in the φ direction is produced in the third circular band 5c integrated with the rigid body 4, and in the short bands 5f connecting the third circular band 5c to the second circular band 5b. Since this elastic deformation of the outermost third circular band 5c with respect to the base 3 via the second circular band 5b compensates for the tilt error between the object and the contact group 1, electric contact obtained by all the contacts of the contact group 1 is uniformized. Thus, this leaf-spring structure is modeled as torque generation caused by torsional deformation of series beams as shown in FIG. 4C. The elasticity modulus (τθ) can be predicted, based on the length and the width of the short band 5*f*, by the formula as follows:

$$\tau_\phi = \frac{1}{2}\tau(W, L)$$ [FORMULA 6]

A load imbalance at one side of the contact group causes a torque with respect to the conical pivot at the center, which causes tilt deformation in the θ and φ oscillation degrees of freedom. Thus, the tilt deformation compensates for a tilt error. An elasticity modulus for oscillation degrees of freedom needs to be set at a sufficiently low level (in the design for the leaf spring) such that the ratio of a load imbalance of the contacts to the average load of the entire contact group is lower than a certain level (for example, lower than 10%), the load imbalance being associated with a correction of tilt between the substrate provided with the contact group and a wafer of the object to be tested.

While mainly the embodiment shown in FIGS. 1 and 2 is described with a focus on the spring structure and the operation, the electric-connection testing device of the present invention is not limited to this embodiment and includes various forms of spring structures that are modified and improved within the scope of the technical idea of the present invention.

Figure 5:
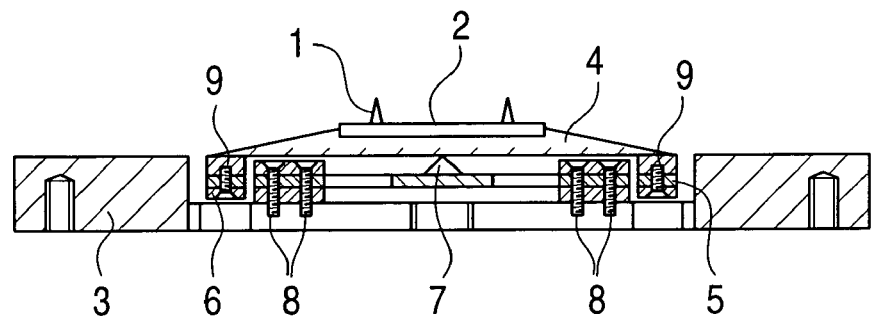
FIG. 5 is a cross-sectional view showing another embodiment of the electric-connection testing device according to the present invention.
Figure 6:
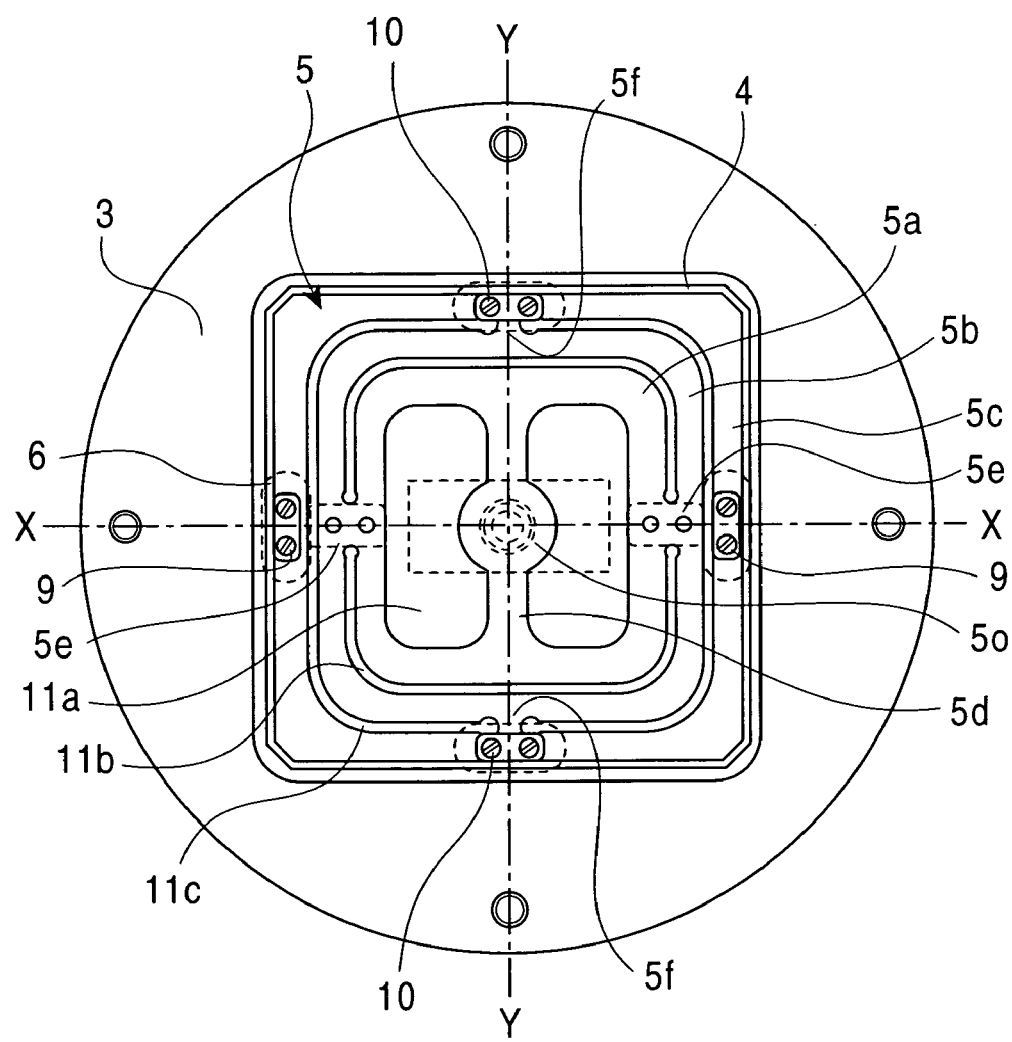
FIG. 6 is a plan view showing another embodiment of the electric-connection testing device according to the present invention.
Figure 10A:
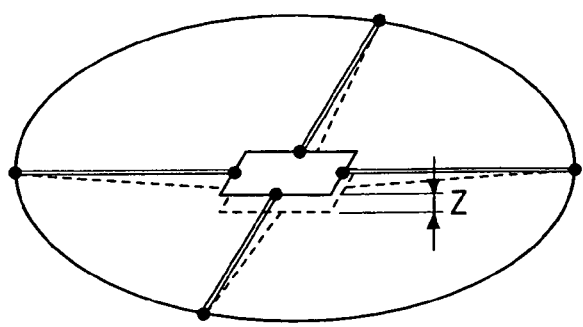
FIGS. 10A to 10C illustrate elastic deformation of a leaf-spring structure in the known electric-connection testing device.
Figure 10B:
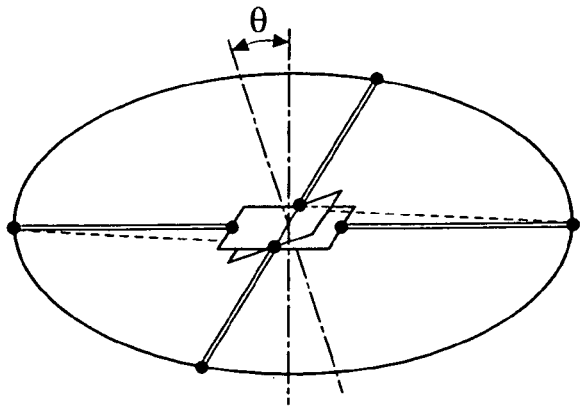
Figure 10C:
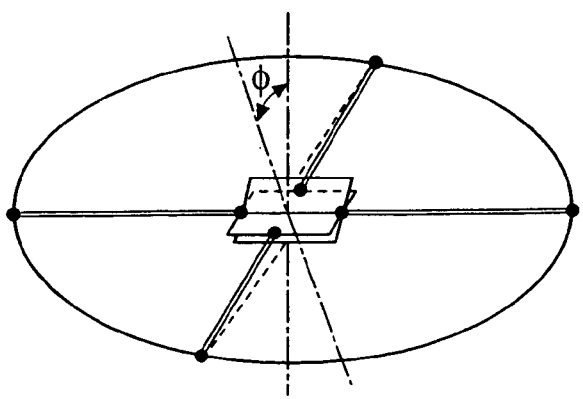

FIGS. 5 and 6 show a modification of the above-described embodiment. In this embodiment, the shape of the rigid body 4 in plan view according to the above-described embodiment is changed from a circle to a rectangle, and the shape of the leaf spring 5 in plan view is also changed to a rectangle. In addition, the conical pivot 7 is not attached to the rigid body 4, but to the leaf spring 5.

A protruding conductive contact group 1 is secured to the upper surface of a rectangular substrate 2 where many traces (not shown) of the contact group 1 are provided. The substrate 2 is mounted on the upper portion of a rigid body 4 in the shape of a truncated pyramid. A rectangular leaf spring 5 having the same shape in plan view as that of the rigid body 4 is disposed under the rigid body 4. The leaf spring 5 is sandwiched between the rigid body 4 and retainers 6 at four points dividing the circumference into four parts, and is secured with two setscrews 9 and 9 each at two positions and with two setscrews 10 and 10 each at two other positions. The leaf spring 5 is sandwiched between a disk-shaped base 3 underneath and retainers 6 and is secured to the base 3 with setscrews 8 at two points. Thus, the base 3 and the rigid body 4 in which the substrate 2 provided with the contact group 1 is mounted are integrated and sandwich the leaf spring 5.

The leaf spring 5 has a rectangular band-plate structure integrally formed in one piece. That is, a disk 5*o* is disposed at the center, and a first rectangular band (first segment) 5*a* surrounding the disk 5*o*, a second rectangular band (second segment) 5*b* surrounding the first rectangular band 5*a*, and an outermost third rectangular band (third segment) 5*c* surrounding the second rectangular band 5*b* are arranged in triple concentric rectangles. The disk 5*o* and the first rectangular band 5*a* are connected by a long linear band 5*d*, which includes two separate portions, extending along a centerline (Y—Y) of the disk and the rectangular bands. The first rectangular band 5*a* and the second rectangular band 5*b* are connected by two short bands 5*e* and 5*e* arranged along a centerline (X—X) orthogonal to the centerline (Y—Y).

Moreover, the second rectangular band 5*b* and the third rectangular band 5*c* are connected by two short bands 5*f* and 5*f* arranged along the centerline (Y—Y). The setscrews 9 and 9 on the third rectangular band 5*c* are located along the centerline (X—X), while the setscrews 10 and 10 on the third rectangular band 5*c* are located along the centerline (Y—Y). As described above, connected portions between the disk and each rectangular band are displaced by 90 degrees with respect to each other so as to integrally form the leaf spring 5 in a so-called gimbal arrangement. Here, semirectangular cutouts 11*a* are formed inside the first rectangular band 5*a*, semirectangular ring-shaped cutouts 11*b* are formed between the first rectangular band 5*a* and the second rectangular band 5*b*, and semirectangular ring-shaped cutouts 11*c* are formed between the second rectangular band 5*b* and the third rectangular band 5*c*.

A conical pivot 7 made of hard metal or ceramic is disposed at the center of the upper portion of the disk 5*o* of the leaf spring 5. As shown in FIG. 5, the upper tip of the conical pivot 7 protruding upward is in contact with and is supported by the center of the lower surface of the rigid body 4.

The leaf spring 5 has an excellent flexible structure that is easily produced by creating the cutouts 11*a* to 11*c* in a single plate, for example, with electrical discharge machining so as to form a triple rectangular band. Since no assembly is required, a high-precision geometric configuration can be directly formed as designed.

What is claimed is:

1. An electric-connection testing device, comprising:
    a substrate provided with a plurality of contacts;
    a rigid body to which the substrate is secured;
    a leaf spring having a spring structure with two or more independent elastic degrees of freedom; and
    a base, the rigid body and the base being integrated and sandwiching the leaf spring,
    wherein the two or more independent elastic degrees of freedom include at least one tilt-correction degree of freedom and one translational degree of freedom in the direction orthogonal to the main surface of the leaf spring.

2. The electric-connection testing device according to claim 1, wherein the two or more independent elastic degrees of freedom include two tilt-correction degrees of freedom and one translational degree of freedom in the direction orthogonal to the main surface of the leaf spring.

3. The electric-connection testing device according to claim 1, wherein the leaf spring is provided with a conical pivot protruding from the center of the leaf spring toward the rigid body, and the tip of the conical pivot is in contact with the rigid body.

4. The electric-connection testing device according to claim 1, the leaf spring comprising:
    a conical pivot protruding from the center of the leaf spring toward the rigid body, the tip of the conical pivot being in contact with the rigid body;
    a first segment including the center of the leaf spring; and
    a second segment that is an annular band plate, the second segment being secured to the base at two points that are opposite with respect to the center of the annular band plate, and being secured to the rigid body at two other points that are opposite with respect to the center of the annular band plate.

5. The electric-connection testing device according to claim 4, wherein the first segment includes an annular band plate and a linear band plate, and the linear band plate includes the center of the leaf spring and is connected to the annular band plate at both ends.

6. The electric-connection testing device according to claim 5, further comprising a third segment that is an annular band plate surrounding the second segment, wherein the second segment and the third segment are double-annular band plates disposed in a gimbal arrangement, and the third segment is connected to the rigid body.

7. An electric-connection testing device, comprising:
a substrate provided with a plurality of contacts;
a rigid body to which the substrate is secured;
a leaf spring having a spring structure with two or more independent elastic degrees of freedom; and
a base, the rigid body and the base being integrated and sandwiching the leaf spring,
wherein the leaf spring has a spring structure in which a single flat plate comprises a plurality of bands.

8. The electric-connection testing device according to claim 7, wherein the leaf spring has an annular band-plate structure surrounding the center of the leaf spring.

9. The electric-connection testing device according to claim 8, wherein the leaf spring has a structure in which double-annular band plates are disposed in a gimbal arrangement.

10. An electric-connection testing device, comprising:
a substrate provided with a plurality of contacts;
a rigid body to which the substrate is secured;
a leaf spring having a spring structure with two or more independent elastic degrees of freedom; and
a base, the rigid body and the base being integrated and sandwiching the leaf spring,
wherein the rigid body is provided with a conical pivot protruding toward the center of the leaf spring, and the tip of the conical pivot is in contact with the center of the leaf spring.

11. An electric-connection testing device comprising:
a substrate provided with a plurality of contacts;
a rigid body to which the substrate is secured;
a leaf spring having a spring structure with two or more independent elastic degrees of freedom; and
a base, the rigid body and the base being integrated and sandwiching the leaf spring,
wherein the rigid body is provided with a conical pivot protruding toward the center of the leaf spring, and the tip of the conical pivot is in contact with the center of the leaf spring, the leaf spring includes:
a first segment including the center of the leaf spring; and
a second segment that is an annular band plate, the second segment being secured to the base at two points that are opposite with respect to the center of the annular band plate, and being secured to the rigid body at two other points that are opposite with respect to the center of the annular band plate.

12. The electric-connection testing device according to claim 11, wherein the first segment includes an annular band plate and a linear band plate, and the linear band plate includes the center of the leaf spring and is connected to the annular band plate at both ends.

13. The electric-connection testing device according to claim 11, further comprising a third segment that is an annular band plate surrounding the second segment, wherein the second segment and the third segment are double-annular band plates disposed in a gimbal arrangement, and the third segment is connected to the rigid body.

* * * * *